United States Patent
Choi

(10) Patent No.: US 8,686,635 B2
(45) Date of Patent: Apr. 1, 2014

(54) ORGANIC LIGHT EMITTING DIODE LIGHTING APPARATUS

(75) Inventor: Sung-Jin Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 13/451,476

(22) Filed: Apr. 19, 2012

(65) Prior Publication Data

US 2013/0010482 A1 Jan. 10, 2013

(30) Foreign Application Priority Data

Jul. 4, 2011 (KR) .................. 10-2011-0066123

(51) Int. Cl.
*F21V 17/08* (2006.01)

(52) U.S. Cl.
USPC ............ 313/512; 313/504; 313/505; 313/506

(58) Field of Classification Search
USPC .................................. 313/495–512
See application file for complete search history.

(56) References Cited

U.S. PATENT DOCUMENTS

| | | | | |
|---|---|---|---|---|
| 5,949,142 A | * | 9/1999 | Otsuka | 257/737 |
| 7,145,289 B2 | * | 12/2006 | Yamazaki et al. | 313/506 |
| 2004/0207315 A1 | * | 10/2004 | Robbie et al. | 313/504 |

FOREIGN PATENT DOCUMENTS

| | | |
|---|---|---|
| JP | 2009-076387 | 4/2009 |
| JP | 2009-087676 | 4/2009 |
| JP | 2010-093151 | 4/2010 |
| KR | 10-2009-0132683 | 12/2009 |

* cited by examiner

*Primary Examiner* — Anh Mai
*Assistant Examiner* — Elmito Breval
(74) *Attorney, Agent, or Firm* — Christie, Parker & Hale, LLP

(57) ABSTRACT

An organic light emitting diode (OLED) lighting apparatus includes an OLED lighting module, and a socket board for mounting the OLED lighting module, wherein the OLED lighting module includes a substrate body including an emission region and a sealing region surrounding the emission region, an OLED on the substrate body, a sealant on the sealing region of the substrate body, and including a conductive member electrically coupled to the OLED, a printed circuit board (PCB) bonded to the substrate body by the sealant for sealing and covering the OLED, and including external input terminals electrically coupled to the conductive member, and an affixing unit on the external input terminals, and wherein the socket board has a supporting unit coupled to the affixing unit for attaching the OLED lighting module thereto.

21 Claims, 4 Drawing Sheets

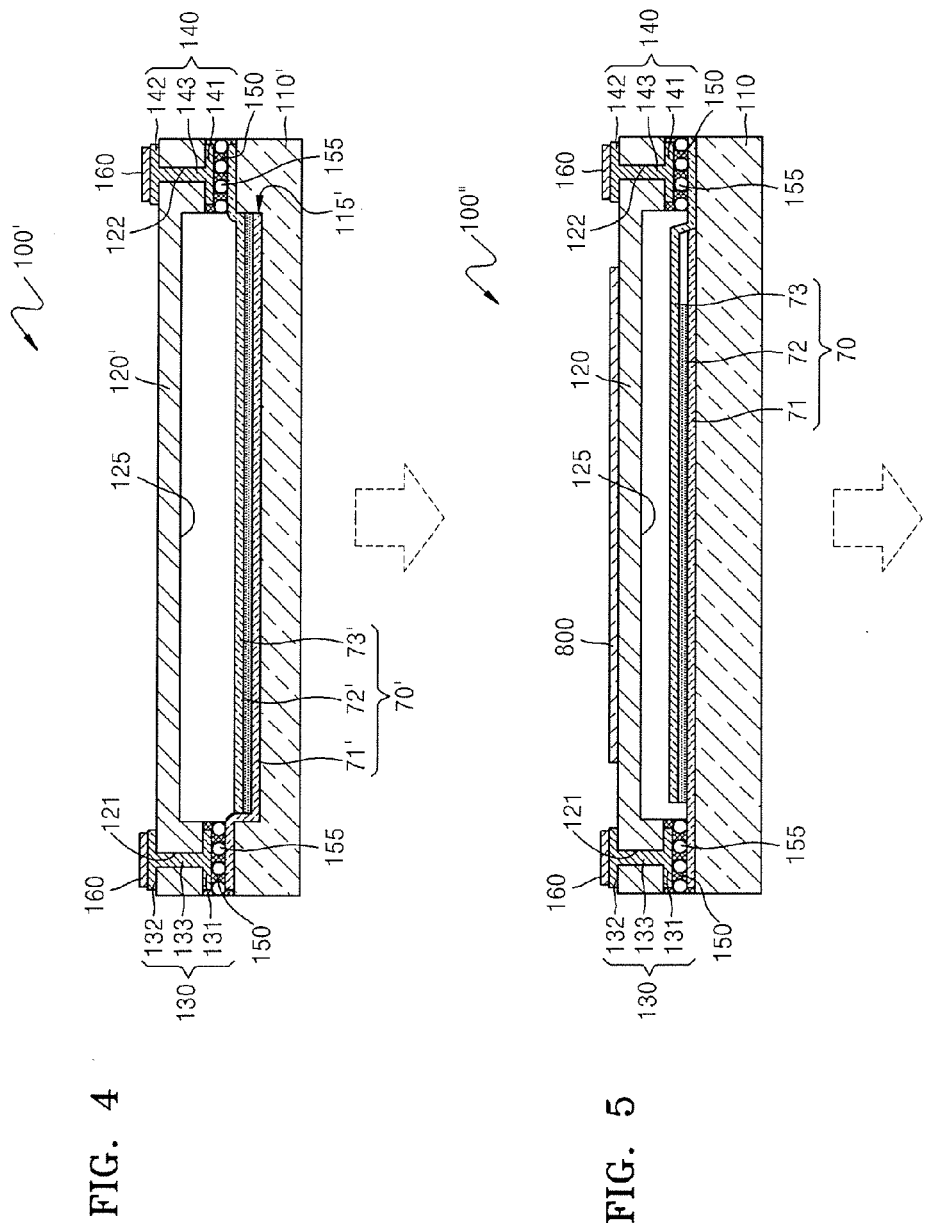

ORGANIC LIGHT EMITTING DIODE LIGHTING APPARATUS

CROSS-REFERENCE TO RELATED PATENT APPLICATION

This application claims priority to and the benefit of Korean Patent Application No. 10-2011-0066123, filed on Jul. 4, 2011, in the Korean Intellectual Property Office, the disclosure of which is incorporated herein in its entirety by reference.

BACKGROUND

1. Field

One or more aspects of the present invention relate to an organic light emitting diode (OLED) lighting apparatus using OLEDs.

2. Description of the Related Art

An organic light emitting diode (OLED) lighting apparatus displays images using light emitted from OLEDs. An OLED generates light by using energy created when excitons, which are formed by combining electrons and holes in an organic emission layer, fall to a base state. An OLED lighting apparatus is merely required to generate light, and thus may have a relatively simple structure in comparison to an OLED display apparatus.

Meanwhile, an OLED lighting apparatus may include an emission region for emitting light, and a non-emission region around the emission region. The non-emission region may include a sealing region for sealing the emission region and a pad region for coupling electrodes of an OLED.

SUMMARY

In an OLED lighting apparatus, an area of the non-emission region in comparison to the emission region should be reduced to improve an emission efficiency.

An aspect of embodiments according to the present invention provides an organic light emitting diode (OLED) lighting apparatus of which an OLED lighting module is easily replaceable.

According to an aspect of embodiments of the present invention, there is provided an organic light emitting diode (OLED) lighting apparatus including an OLED lighting module, and a socket board for mounting the OLED lighting module, wherein the OLED lighting module includes a substrate body including an emission region and a sealing region surrounding the emission region, an OLED on the substrate body, a sealant on the sealing region of the substrate body, and including a conductive member electrically coupled to the OLED, a printed circuit board (PCB) bonded to the substrate body by the sealant for sealing and covering the OLED, and including external input terminals electrically coupled to the conductive member, and an affixing unit on the external input terminals, and wherein the socket board has a supporting unit coupled to the affixing unit for attaching the OLED lighting module thereto.

The affixing unit and the supporting unit may be coupled to each other by a magnetic force.

The affixing unit may be a magnet or an electromagnet.

The supporting unit may be a magnet, an electromagnet, a ferromagnetic substance, or a ferrimagnetic substance.

The affixing unit may be a ferromagnetic substance or a ferrimagnetic substance.

The supporting unit may be a magnet or an electromagnet.

The affixing unit and the supporting unit may be configured to supply power to the OLED lighting module.

The socket board may further include a soldering unit located on one end of the supporting unit and electrically coupled to an external power source.

The external input terminal may include an access unit on one surface of the PCB facing the sealant in the sealing region, a pad unit on another surface of the PCB opposite to the one surface, and an electrical connection unit for electrically coupling the access unit and the pad unit to each other through the PCB.

The OLED may include a first electrode located on the emission region of the substrate body and having one end extending to the sealing region, an organic emission layer on the first electrode in the emission region of the substrate body, and a second electrode located on the organic emission layer and having one end extending to the sealing region and spaced apart from the first electrode.

The external input terminal may include a first external input terminal electrically coupled to the first electrode, and a second external input terminal electrically coupled to the second electrode.

The PCB may further include a first wiring unit electrically coupled to the first external input terminal, and a second wiring unit electrically coupled to the second external input terminal.

The conductive member may include a plurality of conductive balls.

At least one circuit element may be on a surface of the PCB opposite to another surface of the PCB facing the OLED.

A difference between a two-dimensional area of the substrate body and a two-dimensional area of the PCB may be equal to or less than 10% of the area of the substrate body.

The PCB may include a metallic material.

The PCB may have a recess corresponding to the emission region of the substrate body, and may be spaced apart from the OLED in the emission region.

The emission region of the substrate body may be recessed such that the OLED is spaced apart from the PCB in the emission region.

The PCB may include at least one of plastic and glass.

The PCB may have a recess corresponding to the emission region of the substrate body, and may be spaced apart from the OLED in the emission region.

The emission region of the substrate body may be recessed such that the OLED is spaced apart from the PCB in the emission region.

BRIEF DESCRIPTION OF THE DRAWINGS

The above and other features and aspects of embodiments of the present invention will become more apparent by describing in detail exemplary embodiments of the present invention with reference to the attached drawings in which:

FIG. 4 is a cross-sectional view of an OLED lighting module according to another embodiment of the present invention; and FIG. 5 is a cross-sectional view of an OLED lighting module according to yet another embodiment of the present invention.

DETAILED DESCRIPTION

Hereinafter, exemplary embodiments of the present invention will be described in detail by explaining embodiments of the invention with reference to the attached drawings.

Figure 1:
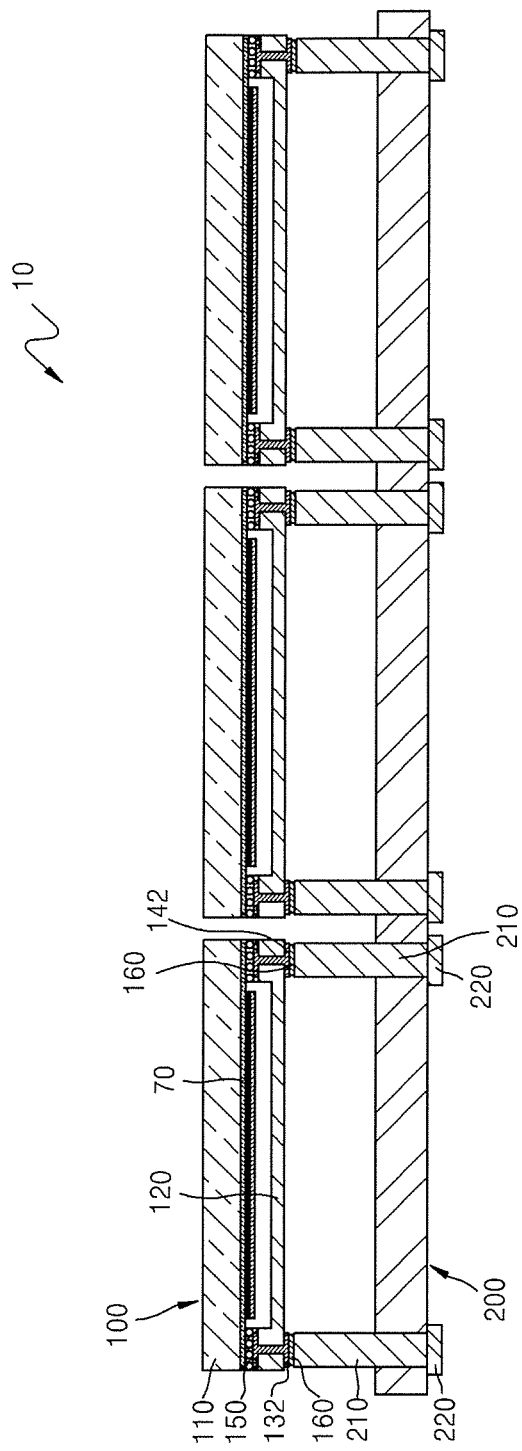
FIG. 1 is a cross-sectional view of an organic light emitting diode (OLED) lighting apparatus according to an embodiment of the present invention.

FIG. 1 is a cross-sectional view of an organic light emitting diode (OLED) lighting apparatus 10 according to an embodiment of the present invention.

Referring to FIG. 1, the OLED lighting apparatus 10 of the present embodiment may include at least one OLED lighting module 100 and a socket board 200.

The OLED lighting module 100 may include a substrate body 110, an OLED 70, a sealant 150, and a printed circuit board (PCB) 120. The OLED lighting module 100 will be described in detail later.

The OLED lighting module 100 may be mounted on the socket board 200. The OLED lighting module 100 may be mounted on the socket board 200 by using a magnetic force. In more detail, the socket board 200 may include a supporting unit 210 for mounting the OLED lighting module 100. One end of the supporting unit 210 of the socket board 200 may be coupled to an affixing unit 160 of the OLED lighting module 100 by using a magnetic force. The supporting unit 210 may be formed of a permanent magnet, an electromagnet, a ferromagnetic substance, or a ferrimagnetic substance that is able to carry electricity. In the present embodiment, the affixing unit 160 may be formed of a permanent magnet or an electromagnet. Also, alternatively, the affixing unit 160 may be formed of a ferromagnetic substance or a ferrimagnetic substance and, in the present embodiment, the supporting unit 210 may be formed of a permanent magnet or an electromagnet. The affixing unit 160 and the supporting unit 210 may be conductors, and external power may be supplied to the OLED lighting module 100 via the affixing unit 160 and the supporting unit 210. A soldering unit 220 may be located on another end of the supporting unit 210. The soldering unit 220 may be coupled to an external power source (not shown).

The affixing unit 160 may be located on first and second pad units 132 and 142.

As described above, since the OLED lighting module 100 is coupled to the socket board 200 by using a magnetic force, the OLED lighting module 100 on the socket board 200 is easily replaceable. Also, conventionally, an OLED lighting module and a socket board are coupled using clips or pogo pins. However, clips may cause damage to the OLED lighting module or warping of the OLED lighting module against the socket board. Pogo pins are expensive and thus may increase a manufacturing cost of an OLED lighting apparatus. In the OLED lighting apparatus 10 of the present embodiment, however, since the OLED lighting module 100 and the socket board 200 are coupled to each other by using a magnetic force, breakage or warping of the OLED lighting module 100 may be reduced or prevented, and a manufacturing cost may be reduced in comparison to a OLED lighting apparatus using pogo pins.

Figure 2:
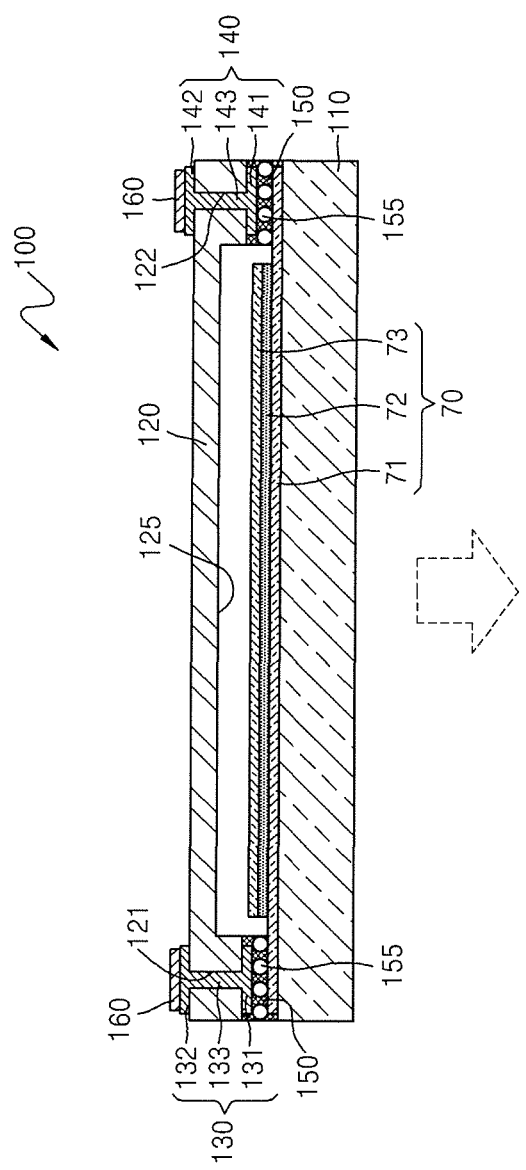
FIG. 2 is a cross-sectional view of an OLED lighting module of the embodiment illustrated in FIG. 1.

FIG. 2 is a cross-sectional view of the OLED lighting module 100 of the embodiment illustrated in FIG. 1.

Referring to FIG. 2, the OLED lighting module 100 may include the substrate body 110, the OLED 70, the sealant 150, and the PCB 120.

The substrate body 110 may be, for example, a transparent insulating substrate formed of glass, quartz, or ceramic, or a transparent flexible substrate formed of plastic.

Also, the substrate body 110 is divided into an emission region and a sealing region surrounding the emission region. The OLED 70 may be formed on the emission region, and the sealant 150 may be formed on the sealing region.

The OLED 70 may include a first electrode 71, an organic emission layer 72, and a second electrode 73.

The first electrode 71 is formed on the emission region of the substrate body 110, and has at least one end extending to the sealing region. The organic emission layer 72 may be formed on the first electrode 71 within the emission region of the substrate body 110. The second electrode 73 is formed on the organic emission layer 72 and is spaced apart from the first electrode 71.

The first electrode 71 is a hole-injection electrode and is an anode (+). The second electrode 73 is an electron-injection electrode and is a cathode (−). However, the present invention is not limited thereto. Accordingly, the first electrode 71 may be an electron-injection electrode, and the second electrode 73 may be a hole-injection electrode.

Also, the first electrode 71 may be a transparent conductive film or a transflective film, and the second electrode 73 may be a reflective film.

The transparent conductive film may be formed of, for example, indium tin oxide (ITO), indium zinc oxide (IZO), zinc oxide (ZnO), and/or indium oxide ($In_2O_3$). The transparent conductive film has a relatively high work function. Accordingly, the first electrode 71 formed as a transparent conductive film may appropriately perform a hole-injection function. Also, if the first electrode 71 is formed as a transparent conductive film, the OLED lighting module 100 may further include an auxiliary electrode formed of metal having a relatively low resistivity in order to compensate for a relatively high resistivity of the first electrode 71.

The reflective film and the transflective film are formed of at least one selected from the group consisting of magnesium (Mg), silver (Ag), gold (Au), calcium (Ca), lithium (Li), chromium (Cr), and aluminum (Al), or an alloy/alloys thereof. In this case, the reflective film or the transflective film is determined according to a thickness. In general, the transflective film according to embodiments of the present invention has a thickness equal to or less than 200 nm. The transflective film has a high transmittance of light if the thickness is small, and has a low transmittance of light if the thickness is large.

If the first electrode 71 is formed as a transflective film and the second electrode 73 is formed as a reflective film, the efficiency of utilizing light may be improved by using a microcavity effect.

Also, according to embodiments of the present invention, the first electrode 71 may be formed in a multilayer structure including a transparent conductive film and a transflective film. In such a scenario, the first electrode 71 may have a high work function and may achieve a microcavity effect.

The organic emission layer 72 may be formed as a multilayer including at least one of an emission layer (EML), a hole-injection layer (HIL), a hole-transport layer (HTL), an electron-transport layer (ETL), and an electron-injection layer (EIL). The above-mentioned layers other than the EML may be omitted if necessary or desired. If the organic emission layer 72 includes all of the above-mentioned layers, the HIL is formed on the first electrode 71, which is a hole-injection electrode, and the HTL, the EML, the ETL, and the EIL are sequentially stacked on the HIL. Also, the organic emission layer 72 may further include other layers if necessary or desired.

As such, the OLED lighting module 100 has a bottom emission structure in which light generated from the organic emission layer 72 passes through the first electrode 71 and the substrate body 110, and is then emitted externally. In FIG. 2, a dashed arrow represents a direction for emitting light.

The sealant 150 may be formed on the sealing region of the substrate body 110. The sealant 150 may include a conductive member 155. According to embodiments of the present invention, the conductive member 155 is formed of a plurality of conductive balls (e.g., conductive particles). However, the present invention is not limited thereto.

The conductive member 155 may be coupled to the first electrode 71 and the second electrode 73 of the OLED 70.

The PCB 120 is bonded to the substrate body 110 by the sealant 150 so as to seal and cover the OLED 70. That is, in the current embodiment, the OLED lighting module 100 does not include an encapsulation member for sealing and covering the OLED 70, and the PCB 120 functions as the encapsulation member.

The PCB 120 has a recess 125 corresponding to the emission region of the substrate body 110. As such, the PCB 120 may be spaced apart from the OLED 70 in the emission region. Accordingly, the PCB 120 is bonded to the substrate body 110 by the sealant 150 and is spaced apart from the OLED 70, thereby reducing or preventing damage of the OLED 70.

Also, the PCB 120 may include first and second external input terminals 130 and 140 coupled to the conductive member 155 of the sealant 150.

The first and second external input terminals 130 and 140 may respectively include: first and second access units 131 and 141 formed on one surface of the PCB 120 facing the sealant 150 in the sealing region; first and second pad units 132 and 142 formed on another surface of the PCB 120 opposite to the one surface; and first and second electrical connection units 133 and 143 for respectively coupling the first and second access units 131 and 141 to the first and second pad units 132 and 142 through the PCB 120. Accordingly, the PCB 120 according to embodiments of the present invention may further include first and second electrical connection holes 301 and 302 for respectively forming the first and second electrical connection units 133 and 143. The affixing unit 160 may be located on the first and second pad units 132 and 142. As described above in relation to FIG. 1, the affixing unit 160 may be coupled to the supporting unit 210 of the socket board 200 by using a magnetic force.

Also, the first external input terminal 130 may be coupled to the first electrode 71 of the OLED 70, and the second external input terminal 140 may be coupled to the second electrode 73 of the OLED 70.

As such, the OLED lighting module 100 of the present embodiment may reduce or minimize a non-emission region, which is a region other than the emission region. That is, since the first and second external input terminals 130 and 140 are formed on the PCB 120 in the sealing region, and since the first and second external input terminals 130 and 140 are coupled to the OLED 70 by the conductive member 155 of the sealant 150, the non-emission region of the OLED lighting module 100 may be reduced or minimized to correspond to only the sealing region. That is, the substrate body 110 might not additionally include a separate pad region.

Accordingly, a difference between a two-dimensional area of the substrate body 110 and a two-dimensional area of the PCB 120 may be equal to or less than 10% (e.g., the difference between the two-dimensional area of the substrate body 110 and the two-dimensional area of the PCB 120 may be a two-dimensional area corresponding to approximately 10% of the two-dimensional area of the substrate body 110 or less, or the two-dimensional area of the PCB 120 may be 10% less than the two-dimensional area of the substrate body 110). In such a scenario, if the two-dimensional area of the PCB 120 is similar to the two-dimensional area of the substrate body 110, an area of the non-emission region against the emission region may be reduced or minimized, and thus, aspects of the present embodiment may be improved or maximized.

Figure 3:
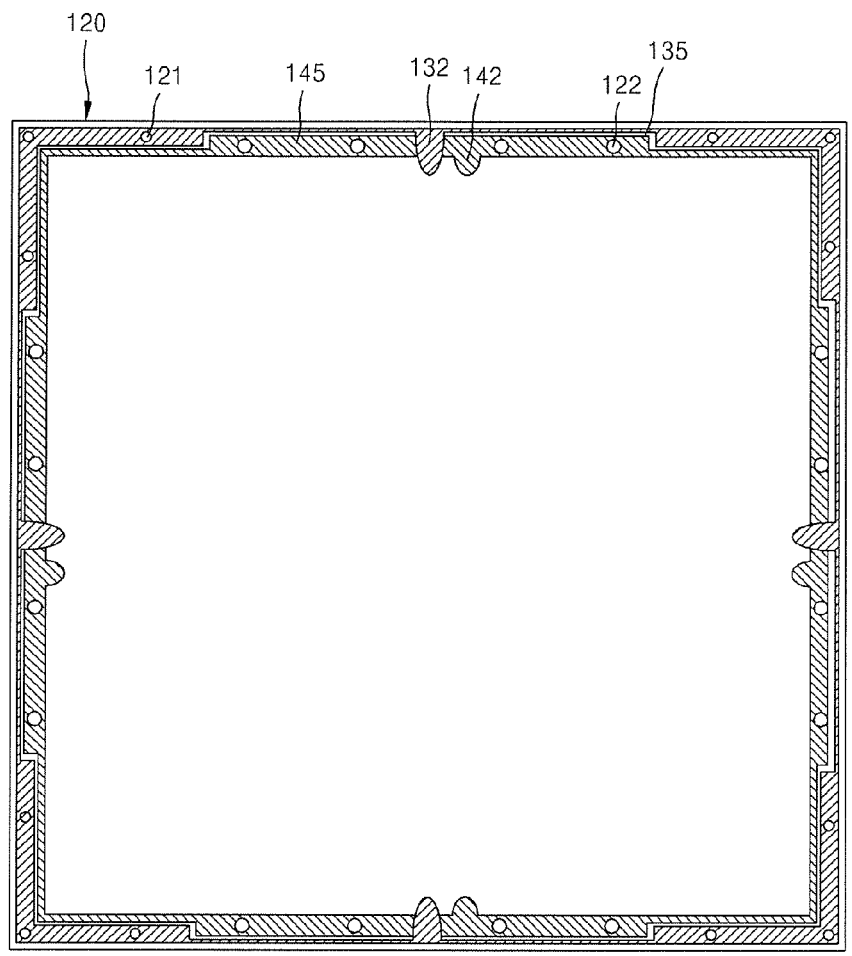
FIG. 3 is a plan view of a printed circuit board (PCB) of the OLED lighting module of the embodiment illustrated in FIG. 2.

Also, as illustrated in FIG. 3, the PCB 120 may further include a first wiring unit 135 coupled to the first pad unit 132 of the first external input terminal 130 (see FIG. 2), and a second wiring unit 145 coupled to the second pad unit 142 of the second external input terminal 140 (see FIG. 2). According to the present embodiment, a plurality of first external input terminals 130 and a plurality of second external input terminals 140 may be formed. The first and second wiring units 135 and 145 may respectively electrically couple the plurality of first pad units 132 and the plurality of second pad units 142, or may respectively electrically couple the first and second external input terminals 130 and 140 to another circuit element.

Also, in the present embodiment, the PCB 120 is a metal PCB formed of a metallic material. For example, the PCB 120 may include an aluminum (Al) substrate as a base, and may further include an insulating layer anode-oxidized on a surface of the Al substrate. Also, the first and second external input terminals 130 and 140 may be formed by contact-patterning copper (Cu) foil on the insulated Al substrate, and various other wirings may be further formed.

As described above, since the PCB 120 is a metal PCB, the heat radiation efficiency of the OLED lighting module 100 may be improved. The metal PCB has a relatively high thermal conductivity, and may thus provide excellent heat radiation.

Furthermore, since the metallic material provides an excellent moisture-proof/moisture resistant effect, if a metal PCB is used as the PCB 120, an overall moisture-proof/moisture resistant property of the OLED lighting module 100 may be improved.

As a result of the aforementioned properties, the durability and the life of the OLED lighting module 100 according to embodiments of the present invention may also be improved.

However, the current embodiment is not limited thereto. Accordingly, the PCB 120 may be formed of a material including at least one of plastic and glass. For example, the PCB 120 may be formed of epoxy resin such as FR4, which will be known to one having ordinary skill in the art. If the PCB 120 is formed of a material such as FR4, the OLED lighting module 100 may effectively have flexibility. Also, the PCB 120 may be relatively easily manufactured.

Based on the above structure, the OLED lighting module 100 of embodiments of the present invention may have a simple structure and may effectively improve an emission efficiency.

In more detail, the OLED lighting module 100 may reduce or minimize the area of the non-emission region against the emission region (e.g., may reduce or minimize the ratio of the area of the non-emission region to the area of the emission region). Accordingly, the OLED lighting module 100 may increase a total amount of light against an area, and thus, the life of the OLED lighting apparatus 10 may be increased. Also, the amount of light at the same current density may be improved.

Furthermore, an overall structure of the OLED lighting module 100 may be simplified, and thus, productivity may be improved.

In addition, if a metal PCB is used as the PCB 120, a heat radiation efficiency and a moisture-proof effect may also be improved.

Furthermore, a PCB including at least one of plastic and glass may be used as the PCB 120, and the OLED lighting module 100 may be easily manufactured and may have flexibility.

Also, according to the present embodiment, since an area of the non-emission region of the OLED lighting module 100 is reduced or minimized, the OLED lighting apparatus 10 may be easily manufactured in a large scale by using a plurality of OLED lighting modules 100.

FIG. 4 is a cross-sectional view of an OLED lighting module 100' according to another embodiment of the present invention.

As illustrated in FIG. 4, the OLED lighting module 100' includes a recess 115' formed on an emission region of a substrate body 110'. The OLED 70 may be formed in the recess 115' of the substrate body 110'.

As described above, since the emission region of the substrate body 110', on which the OLED 70 is formed, is recessed, the OLED 70 may be spaced apart from the PCB 120'. Accordingly, the PCB 120' may be bonded to the substrate body 110' by the sealant 150 and may be spaced apart from the OLED 70, thereby reducing or preventing damage of the OLED 70.

Also, in the current embodiment, the PCB 120' may also be a metal PCB or a PCB including at least one of plastic and glass.

As such, the OLED lighting module 100' may have a simple structure and may effectively improve an emission efficiency.

FIG. 5 is a cross-sectional view of an OLED lighting module 100" according to another embodiment of the present invention.

As illustrated in FIG. 5, the OLED lighting module 100" may further include at least one circuit element 800 formed on a surface of the PCB 120 opposite a surface of the PCB 120 facing the OLED 70. The circuit element 800 supplies a driving signal to the OLED 70. The circuit element 800 may be respectively coupled to the first and second external input terminals 130 and 140 via the first and second wiring units 135 and 145 (see FIG. 3) or other wirings.

Accordingly, the OLED lighting module 100" of the present embodiment might not require a circuit board or a power source unit coupled via the first and second external input terminals 130 and 140, and may thus have a simpler structure.

Also, in the present embodiment, the PCB 120 may also be a metal PCB or a PCB including at least one of plastic and glass.

As such, the OLED lighting module 100" may have a simple structure and may effectively improve an emission efficiency.

According to the above embodiments of the present invention, an OLED lighting module is easily replaceable.

While embodiments of the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light emitting diode (OLED) lighting apparatus comprising:
an OLED lighting module; and
a socket board for mounting the OLED lighting module, wherein the OLED lighting module comprises:
a substrate body comprising an emission region and a sealing region surrounding the emission region;
an OLED on the substrate body;
a sealant on the sealing region of the substrate body, and comprising a conductive member electrically coupled to the OLED;
a printed circuit board (PCB) bonded to the substrate body by the sealant for sealing and covering the OLED, and comprising external input terminals electrically coupled to the conductive member; and
an affixing unit on the external input terminals, and
wherein the socket board has a supporting unit coupled to the affixing unit for attaching the OLED lighting module thereto.

2. The OLED lighting apparatus of claim 1, wherein the affixing unit and the supporting unit are coupled to each other by a magnetic force.

3. The OLED lighting apparatus of claim 2, wherein the affixing unit is a magnet or an electromagnet.

4. The OLED lighting apparatus of claim 3, wherein the supporting unit is a magnet, an electromagnet, a ferromagnetic substance, or a ferrimagnetic substance.

5. The OLED lighting apparatus of claim 2, wherein the affixing unit is a ferromagnetic substance or a ferrimagnetic substance.

6. The OLED lighting apparatus of claim 5, wherein the supporting unit is a magnet or an electromagnet.

7. The OLED lighting apparatus of claim 1, wherein the affixing unit and the supporting unit are configured to supply power to the OLED lighting module.

8. The OLED lighting apparatus of claim 1, wherein the socket board further comprises a soldering unit located on one end of the supporting unit and electrically coupled to an external power source.

9. The OLED lighting apparatus of claim 1, wherein the external input terminal comprises:
an access unit on one surface of the PCB facing the sealant in the sealing region;
a pad unit on another surface of the PCB opposite to the one surface; and
an electrical connection unit for electrically coupling the access unit and the pad unit to each other through the PCB.

10. The OLED lighting apparatus of claim 9, wherein the OLED comprises:
a first electrode located on the emission region of the substrate body and having one end extending to the sealing region;
an organic emission layer on the first electrode in the emission region of the substrate body; and
a second electrode located on the organic emission layer and having one end extending to the sealing region and spaced apart from the first electrode.

11. The OLED lighting apparatus of claim 10, wherein the external input terminal comprises:
a first external input terminal electrically coupled to the first electrode; and
a second external input terminal electrically coupled to the second electrode.

12. The OLED lighting apparatus of claim 11, wherein the PCB further comprises:
a first wiring unit electrically coupled to the first external input terminal; and
a second wiring unit electrically coupled to the second external input terminal.

13. The OLED lighting apparatus of claim 1, wherein the conductive member comprises a plurality of conductive balls.

14. The OLED lighting apparatus of claim 1, wherein at least one circuit element is on a surface of the PCB opposite to another surface of the PCB facing the OLED.

15. The OLED lighting apparatus of claim 1, wherein a difference between a two-dimensional area of the substrate body and a two-dimensional area of the PCB is equal to or less than 10% of the area of the substrate body.

16. The OLED lighting apparatus of claim 1, wherein the PCB comprises a metallic material.

17. The OLED lighting apparatus of claim 16, wherein the PCB has a recess corresponding to the emission region of the substrate body, and is spaced apart from the OLED in the emission region.

18. The OLED lighting apparatus of claim 16, wherein the emission region of the substrate body is recessed such that the OLED is spaced apart from the PCB in the emission region.

19. The OLED lighting apparatus of claim 1, wherein the PCB comprises at least one of plastic and glass.

20. The OLED lighting apparatus of claim 19, wherein the PCB has a recess corresponding to the emission region of the substrate body, and is spaced apart from the OLED in the emission region.

21. The OLED lighting apparatus of claim 19, wherein the emission region of the substrate body is recessed such that the OLED is spaced apart from the PCB in the emission region.

* * * * *